US011152528B2

(12) United States Patent
Hall et al.

(10) Patent No.: US 11,152,528 B2
(45) Date of Patent: Oct. 19, 2021

(54) NON-CONTIGUOUS LAYOUTS FOR PHOTOSENSITIVE APPARATUS

(71) Applicant: STMicroelectronics (Research & Development) Limited, Marlow (GB)

(72) Inventors: Duncan Hall, Edinburgh (GB); Bruce Rae, Edinburgh (GB)

(73) Assignee: STMicroelectronics (Research & Development) Limited, Marlow (GB)

( * ) Notice: Subject to any disclaimer, the term of this patent is extended or adjusted under 35 U.S.C. 154(b) by 0 days.

(21) Appl. No.: 16/560,527

(22) Filed: Sep. 4, 2019

(65) Prior Publication Data

US 2020/0083395 A1    Mar. 12, 2020

(30) Foreign Application Priority Data

Sep. 6, 2018   (EP) ...................................... 18192988

(51) Int. Cl.
  *H01L 31/107*   (2006.01)
  *H01L 27/144*   (2006.01)
  *H01L 31/12*    (2006.01)
  *G01S 7/481*    (2006.01)
  *G01S 17/89*    (2020.01)

(52) U.S. Cl.
  CPC .......... *H01L 31/107* (2013.01); *H01L 27/144* (2013.01); *H01L 31/125* (2013.01); *G01S 7/4816* (2013.01); *G01S 17/89* (2013.01)

(58) Field of Classification Search
  CPC ..................... H01L 31/107; H01L 31/125
  See application file for complete search history.

(56) References Cited

U.S. PATENT DOCUMENTS

2015/0285625 A1* 10/2015 Deane ..................... G01S 17/48
                                                              348/140

FOREIGN PATENT DOCUMENTS

WO    2017/112416 A1    6/2017

OTHER PUBLICATIONS

Perenzoni et al., "A 64×64-Pixels Digital Silicon Photomultiplier Direct TOF Sensor With 100-MPhotons/s/pixel Background Rejection and Imaging/Altimeter Mode With 0.14% Precision up to 6 km for Spacecraft Navigation and Landing," *IEEE Journal of Solid-State Circuits* 52(1):151-160, Jan. 2017.

* cited by examiner

*Primary Examiner* — Jay C Chang
*Assistant Examiner* — Mikka Liu
(74) *Attorney, Agent, or Firm* — Seed IP Law Group LLP

(57) ABSTRACT

An apparatus includes at least one detector configured to receive return light from an object within a detector field of view the light generated by a light source. The detector includes first and second photosensitive regions configured to receive the return light from the light source. At least one non-photosensitive region is included, and the first and second photosensitive regions are separated by the at least one non-photosensitive region. The at least one non-photosensitive region is associated with one of the first or second photosensitive regions.

20 Claims, 11 Drawing Sheets

NON-CONTIGUOUS LAYOUTS FOR PHOTOSENSITIVE APPARATUS

BACKGROUND

Technical Field

Some embodiments relate to an apparatus and in particular but not exclusively to an apparatus with an array of photosensitive devices.

Description of the Related Art

Photosensitive devices are employed in a range of applications, for example determination of light levels, communications, range detection, etc. In order to increase spatial efficiency the photosensitive pixels and control logic or other logic are integrated onto a single package.

For example single photon avalanche diodes (SPAD) may be used as a detector of reflected light. In general, an array of pixels including SPAD sensing elements are provided as a sensor in order to detect a reflected light pulse. A photon may generate a carrier in the SPAD through the photo electric effect. The photo generated carrier may trigger an avalanche current in one or more of the SPADs in an SPAD array. The avalanche current may signal an event, namely that a photon of light has been detected.

The use of SPAD arrays for ranging is well known. For example SPAD arrays and SPAD sensors have been used to determine time-of-flight distances for ranging applications in mobile devices.

The SPAD detector may comprise areas of photosensitive material and areas of non-photosensitive area such as used for the quench circuitry, pulse conditioning logic, aggregation logic, digital counters and other logic.

Structured light sources, in other words light sources which generate a determined light pattern are known and have been used for example in many products. They have an advantage over conventional 'flash' light sources in that by using a defined pattern of light spots an environment may be illuminated at a level sufficient to provide a good quality output at an overall significantly lower power level. Furthermore the illumination levels may be more easily to kept to Maximum Permissible Exposure (MPE) levels and thus be cleared for general use.

Conventional photosensitive detectors, such as SPAD detector arrays may not produce good efficiencies, for example where structured light is used.

BRIEF SUMMARY

According to some embodiments there is provided an apparatus comprising at least one detector configured to receive return light from an object within a detector field of view the light generated by a light source wherein the detector comprises: first and second photosensitive regions configured to receive the return light from the light source, each of the first and second photosensitive regions including a respective plurality of photodiodes; and at least one non-photosensitive region, wherein the first and second photosensitive regions are separated by the at least one non-photosensitive region and the at least one non-photosensitive region is associated with one of the first or second photosensitive regions.

The first and second photosensitive regions may comprise first and second photodiodes, and the at least one non-photosensitive region may comprise circuitry associated with one of the first or second photodiodes.

The first and second photosensitive regions may comprise first and second macro-pixels, and the first and second macro-pixels may each include two or more photodiodes arranged in a defined configuration, and the at least one non-photosensitive region may comprise circuitry associated with one of the first or second macro-pixels.

The first and second photosensitive regions may comprise first and second arrays of macro-pixels, and the macro-pixels of the first and second arrays of macro-pixels may each include two or more photodiodes arranged in a defined configuration, and the at least one non-photosensitive region may comprise circuitry associated with one of the first or second arrays macro-pixels.

The light source may be a structured light source configured to generate a structured light pattern having at least two separate light pattern elements.

The first and second photosensitive regions may be first and second macro-pixels, and the first and second macro-pixels may each comprise two or more photodiodes arranged in a defined configuration and wherein within each macro-pixel the two or more photodiodes are selectably enabled or disabled.

The apparatus may be configured to selectably enable or disable the two or more photodiodes within each macro-pixel based on a detection of one of the at least two light pattern elements from the structured light source.

The first and second photosensitive regions may be arranged on the detector to match an expected return light pattern based on the structured light pattern.

The first and second photosensitive regions may include at least one single photon avalanche diode.

The at least one non-photosensitive region may include at least one of: quench logic; signal conditioning logic for processing outputs of the associated photosensitive region; digital counter logic associated with the photosensitive region; aggregation logic associated with the photosensitive region; or timing logic associated with the photosensitive region.

The apparatus may further comprise the structured light source.

The structured light source may comprise at least one of: at least one vertical cavity side emitting laser; and a diffractive optical element.

The structured light having at least two separate light pattern elements may comprise an array of light beams.

According to one or more embodiments there is provided a method comprising: forming a photosensitive detector by: forming at least two photosensitive regions configured to receive return light from a light source; and forming at least one non-photosensitive region, wherein the at least two photosensitive regions are separated by the at least one non-photosensitive region and the at least one non-photosensitive region is associated with one of the at least two photosensitive regions.

Forming the at least two photosensitive regions may comprise: forming two photodiodes, and the at least one non-photosensitive region comprises circuitry associated with one of the two photodiodes.

Forming the at least two photosensitive regions may comprise: forming two macro-pixels, the two macro-pixels each including two or more photodiodes arranged in a defined configuration, and the at least one non-photosensitive region comprises circuitry associated with one of the two macro-pixels.

Forming the at least two photosensitive regions may comprise: forming two arrays of macro-pixels, the macro-pixels of the two arrays of macro-pixels each including two or more photodiodes arranged in a defined configuration, and the at least one non-photosensitive region comprises circuitry associated with one of the two arrays macro-pixels.

Forming two macro-pixels may comprise forming two or more photodiodes arranged in a defined configuration and wherein within each macro-pixel the two or more photodiodes may be selectably enabled or disabled.

The light source may be a structured light source configured to generate a structured light pattern having at least two separate light pattern elements.

The method may further comprise selectably enabling or disabling the two or more photodiodes within each macro-pixel based on a detection of a light pattern element from the structured light source.

The method may further comprise arranging the at least two photosensitive regions on the detector to match an expected return light pattern based on the structured light source light pattern.

The at least two photosensitive regions may include at least one single photon avalanche diode.

The at least one non-photosensitive region may include at least one of: quench logic; signal conditioning logic for processing outputs of the associated photosensitive region; digital counter logic associated with the photosensitive region; aggregation logic associated with the photosensitive region; or timing logic associated with the photosensitive region.

The method may further comprise generating a structured light pattern.

According to one or more embodiments there is provided an apparatus comprising: at least two photosensitive means for receiving return light from a light source; and at least one non-photosensitive means, wherein the at least two photosensitive means are separated by the at least one non-photosensitive means and the at least one non-photosensitive means is associated with one of the at least two photosensitive means.

The at least two photosensitive means may comprise at least one of: two photodiodes, and the at least one non-photosensitive region comprises circuitry associated with one of the two photodiodes; two macro-pixels, the macro-pixels each including two or more photodiodes arranged in a defined configuration, and the at least one non-photosensitive region comprises circuitry associated with one of the two macro-pixels; or two arrays of macro-pixels, the macro-pixels each including two or more photodiodes arranged in a defined configuration, and the at least one non-photosensitive region comprises circuitry associated with one of the two arrays macro-pixels.

The at least two photosensitive means may comprise the two macro-pixels, wherein within each macro-pixel the two or more photodiodes may be selectably enabled or disabled.

The light source may be a structured light source configured to generate a structured light pattern having at least two separate light pattern elements.

The apparatus may further comprise switching means for selectably enabling or disabling the two or more photodiodes within each macro-pixel based on a detection of a light pattern element from the structured light source.

The apparatus may further comprise the at least two photosensitive means configured to match an expected return light pattern based on the structured light source light pattern.

The at least two photosensitive means may include at least one single photon avalanche diode.

The at least one non-photosensitive means may include at least one of: quench logic; signal conditioning logic for processing outputs of the associated photosensitive region; digital counter logic associated with the photosensitive region; aggregation logic associated with the photosensitive region; or timing logic associated with the photosensitive region.

The apparatus may further comprise means for generating a structured light pattern.

BRIEF DESCRIPTION OF THE SEVERAL VIEWS OF THE DRAWINGS

Some embodiments will now be described by way of example only and with reference to the accompanying Figures in which.

DETAILED DESCRIPTION

Figure 1:
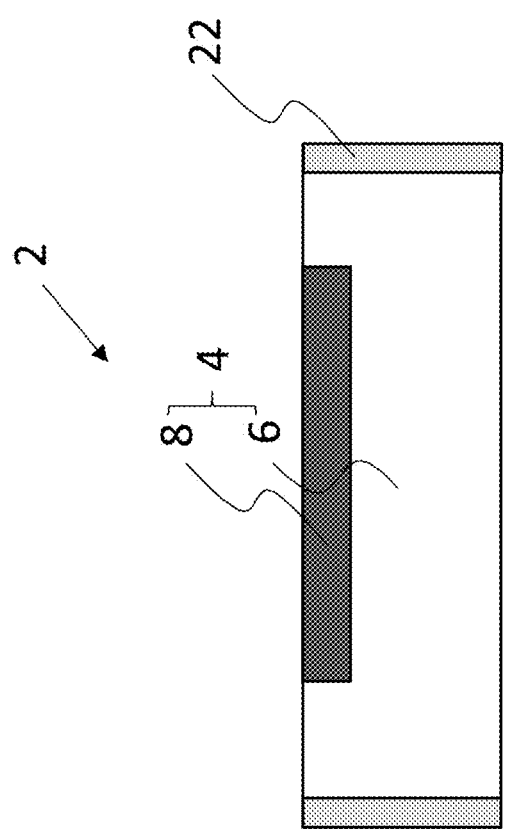
FIG. 1 shows a schematic view of an avalanche diode as an example of a photosensitive pixel according to some embodiments.

In various embodiments provided herein, a photosensitive detector configuration comprises noncontiguous photosensitive areas separated by non-photosensitive areas. This for example may be a single photon avalanche diode (SPAD) module arrangement or configuration configured to receive a structured light pattern and may then provide the SPAD module with a higher quantum efficiency than conventional SPAD configurations.

In some embodiments this detector arrangement is one wherein photosensitive diodes (or pixels) are separated from other photosensitive diodes by logic regions (or non-photodetecting regions) of the integrated circuit.

In some embodiments the detector arrangement may be one wherein there are clusters of photosensitive diodes (or pixels), which may be called macro-pixels. These macropixels are separated from other macro-pixels by logic regions (or non-photodetecting regions) of the integrated circuit. This for example may be employed within a SPAD based detection system with a transmitter configured to transmit a structured light output which is reflected and returns to the SPAD based detector where the macro-pixels are located at the expected return locations for elements of the returned structured light and logic non-photosensitive regions between these photosensitive regions. It is understood that in some embodiments the structured light generator and the detector may be physically separate modules or be implemented in a suitable optical apparatus. Thus for example a LIDAR (light detection and ranging) system may be implemented using a structured light generator module and light detector located in an optically calibrated apparatus.

A basic element of the detector arrangement is the photodiode. A diode is an electrical device allowing current to move through it in one direction with far greater ease than in the other. The most common kind of diode in modern circuit design is the semiconductor diode and is based on a p-n junction or PIN (p-intrinsic-n) structure.

A p-n junction includes a P region (i.e., region doped with a P dopant) and an N region (i.e., region doped with an N dopant type). The N region contains electrons in excess while the P region contains holes in excess. When the p-n junction is formed holes are naturally diffused from the P region to the N region and recombined with electrons. Likewise, electrons are naturally diffused from the N region to the P region and are recombined with holes. In this way, a depletion region with pairs of recombined holes and electrons is formed at the interface (i.e., the junction) of the P region and the N region.

The diffusion of holes from the P region leaves negative acceptor ions in the P region while the diffusion of electrons from the N region leaves positive donor ions in the N region. This creates a depletion region electric field that provides a force opposing the continued diffusion of holes and electrons. When the depletion region electric field is sufficiently high the diffusion of holes and electrons is interrupted and the depletion region reaches an equilibrium.

The width of the depletion region depends on the concentration of holes in the P region, the concentration of electrons in the N region and a voltage supply applied to the PN junction.

When a photon of sufficient energy strikes the diode, it creates an electron-hole pair. This mechanism is also known as the photoelectric effect. If the absorption occurs in the junction's depletion region, or one diffusion length away from it, these carriers are swept from the junction by the built-in electric field of the depletion region. Thus holes move toward the anode, and electrons toward the cathode, and a photocurrent is produced. The total current through the photodiode is the sum of the dark current (current that is generated in the absence of light) and the photocurrent.

When the voltage supply is a forward bias voltage supply, the P region is connected with a positive terminal of the voltage supply and the N region is connected with a negative terminal of the voltage supply. In this way, the holes in the P region and the electrons in the N region are pushed toward the interface of the P region and the N region. The width of the depletion region decreases. When used in zero bias or photovoltaic mode, the flow of photocurrent out of the device is restricted and a voltage builds up. This mode exploits the photovoltaic effect.

When the voltage supply is a reverse bias voltage supply, the P region is connected with a negative terminal of the voltage supply and the N region is connected with a positive terminal of the voltage supply. In this way, the holes in the P region and the electrons in the N region are pushed away from the interface of the P region and the N region. The width of the depletion region increases. In this mode, the response time is reduced because the additional reverse bias increases the width of the depletion layer, which decreases the junction's capacitance.

The width of the depletion region increases with the increase in reverse bias voltage supply up to a voltage. If the reverse bias voltage supply is increased beyond that voltage, the junction breaks down and allows a reverse current. At this point, a small increase in the voltage will rapidly increase the reverse current. The voltage at which the PN junction breaks down occurs is known as the "breakdown voltage".

The depletion region breakdown may be caused by two mechanisms: zener breakdown and avalanche breakdown.

In avalanche breakdown, when the reverse voltage supply exceeds the breakdown voltage, electrons diffused in the depletion region are accelerated. The electrons collide with atoms and free bound electrons. Some of these electrons recombine with holes. Others are accelerated in the depletion region, collide with atoms and free further bound electrons, and so on. Likewise, holes diffused in the depletion region area are accelerated in the opposite direction and initiate a similar process. In this way, a self-sustaining avalanche is created and the reverse current increases.

An avalanche diode, such as a single photon avalanche detectors (SPAD), follows the above principle. The PN junction is reverse biased at a voltage exceeding the breakdown voltage. When a photon with sufficient energy is absorbed, a bound electron is freed in the depletion region. The electron is accelerated, collide with atoms and frees further bound electrons. Some of these electrons recombine with holes. Others are accelerated, collide with atoms and free further bound electron, and so on. Likewise, holes diffused in the depletion region area are accelerated in the opposite direction and initiate a similar process. In this way, a self-sustaining avalanche is created and the reverse current increases. The avalanche can be stopped by setting the reverse bias voltage supply below the breakdown voltage.

FIG. 1 represents a photo-diode 2 for example a single photon avalanche diode (SPAD).

The avalanche diode 2 comprises a PN junction 4 including a P region 6 (i.e., a region doped with a P dopant) and an N region 8 (i.e., a region doped with an N dopant). In an implementation, the P region 6 is an epitaxial layer of P dopant type grown on a Silicon substrate (not represented) and the N region 8 is a well of N dopant type formed within the epitaxial layer. Here, the N region 8 is centered (i.e., aligned with a central longitudinal axis). The PN junction 4 comprises a depletion region (also known as depletion layer or depletion zone) that is naturally formed at the interface (i.e., junction) of the P region 6 and the N region 8 as described above.

The avalanche diode 2 comprises an anode (not represented) connecting the P region 6 to a negative terminal of a voltage supply 10 and a cathode (not represented) connecting the N region 8 to a positive terminal of the voltage supply 12.

The avalanche diode 2 may advantageously comprise a trench isolation region 22 surrounding the PN junction 4 to prevent current leakage from/toward adjacent semiconductor device components. The trench isolation region 22 is for example made of Silicon Dioxide ($SiO_2$).

The avalanche diode 2 shown in FIG. 1 may be a back side illuminated avalanche diode so that the amount of light captured can be increased and low-light performance can be improved. As discussed above, when a photon with sufficient energy is absorbed via the back side, a bound electron is freed in the depletion region, accelerated, collides with atoms and free further bound electrons. Some of these electrons recombine with holes. Others are accelerated in, collide with atoms and free further bound electrons, and so on.

With respect to FIGS. 2A to 2D there are shown examples of non-contiguous detector arrangements which are able to show improved efficiencies on a pixel level.

Figure 2A:
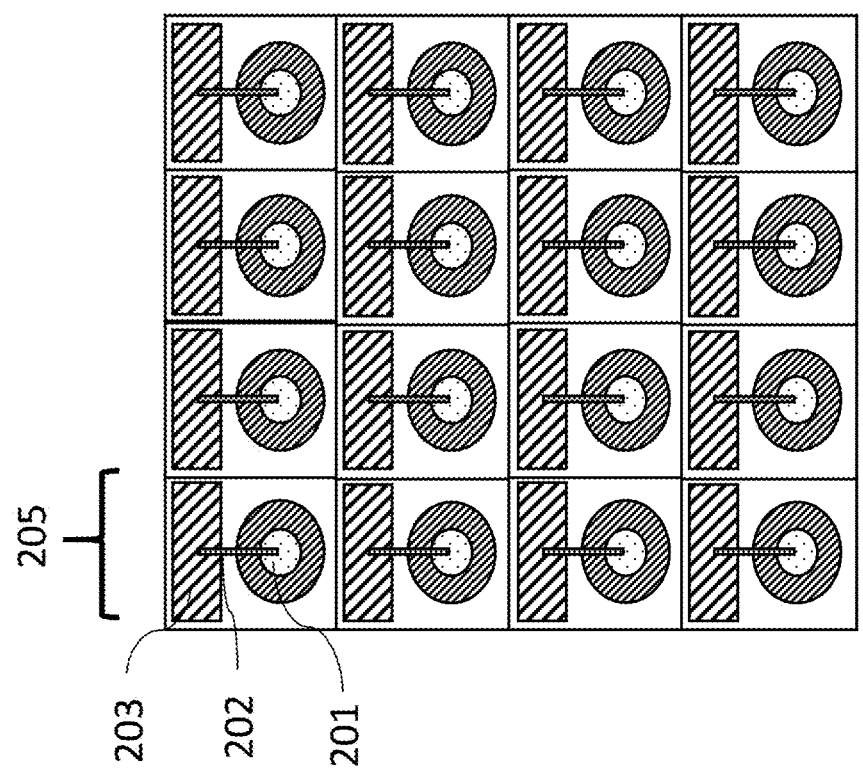
FIGS. 2A to 2D show a schematic view of example photosensitive detector arrangements according to some embodiments.

With respect to FIG. 2A, a first example detector arrangement is shown. The first example detector arrangement is one wherein each individual diode 201 or photosensitive pixel is coupled, via coupling 202, to an individual non-photosensitive region 203. In this example, the arrangement may be considered to be an array of cells, each cell 205 comprising an individual diode 201 and associated non-photosensitive circuitry. Although this example shows the cell to be arranged on a 'north-south' axis with the photosensitive region to the south of the cell and the non-photosensitive region to the north of the cell it is understood that in some embodiments the cell arrangement may be on any suitable axis. Similarly although the cell is shown with non-photosensitive region on one side of the pixel it is understood that in some embodiments the non-photosensitive region may be on two, three or more sides of the cell. Furthermore although the cell is shown in a rectangular form the cell may be any suitable shape, regular or irregular.

In the first example detector arrangement the individual diodes 201 or photosensitive regions are therefore 'separated' from at least one of the neighboring or adjacent diodes by the non-photosensitive region. In such examples this may produce an advantage in that the coupling between the photosensitive areas and the non-photosensitive regions is kept relatively constant from diode to diode and as such any time sensitive signals from the diode to the circuitry are consistently handled.

Figure 2B:
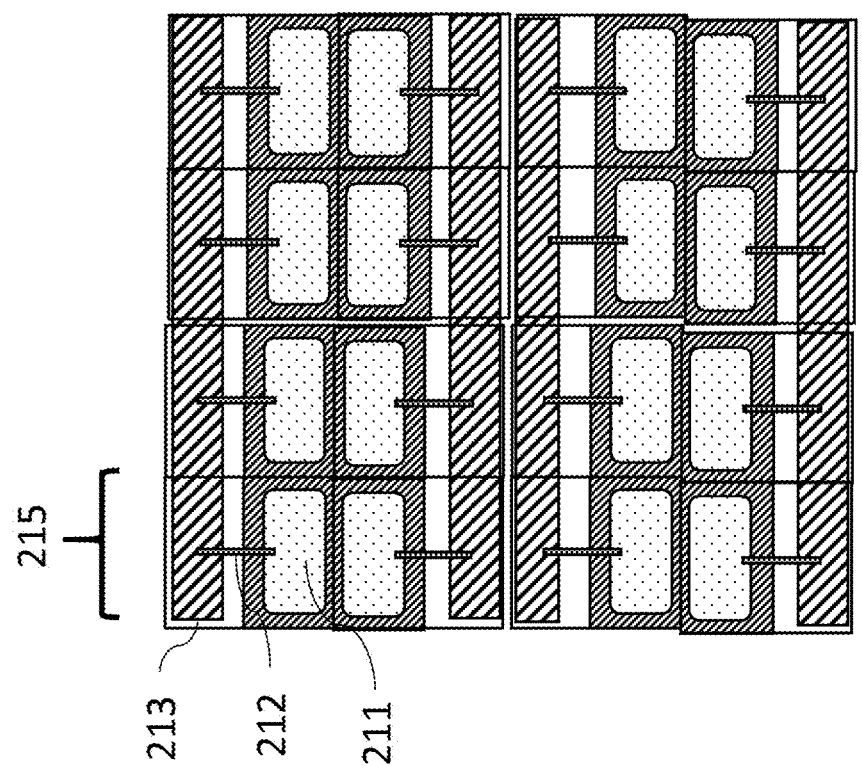

With respect to FIG. 2B, a second example detector arrangement is shown which shows improved efficiencies on a pixel level when compared to the example shown in FIG. 2A. The second example detector arrangement is one wherein diodes 211 or photosensitive pixels are grouped (arranged in lines for example rows or columns) and each diode in a row is coupled, via a suitable coupling 212, to associated non-photosensitive regions 213. In this example the arrangement may be considered to be an array of cells, each cell 215 comprising an individual diode 211 and associated non-photosensitive circuitry 213 and connected to adjacent cells along the row. Although this example shows the cell to be arranged on a 'north-south' axis with one type of cell with the photosensitive region to the south of the cell and the non-photosensitive region to the north of the cell and a second type of cell with the photosensitive region to the north of the cell and the non-photosensitive region to the south of the cell it is understood that in some embodiments the cell arrangement may be on any suitable axis. Similarly although the cell is shown with non-photosensitive region on one side of the pixel it is understood that in some embodiments the non-photosensitive region may be on two sides of the cell. Furthermore although the cell is shown in a rectangular form the cell may be any suitable shape.

In the second example detector arrangement the individual diodes 201 or photosensitive regions are 'separated' from at least one other line (or rows) of neighboring diodes but have a shared row arrangement. These examples may produce a similar advantage in that the coupling between the photosensitive areas and the non-photosensitive regions is kept relatively constant from diode to diode and as such any time sensitive signals from the diode to the circuitry are consistently handled.

Figure 2C:
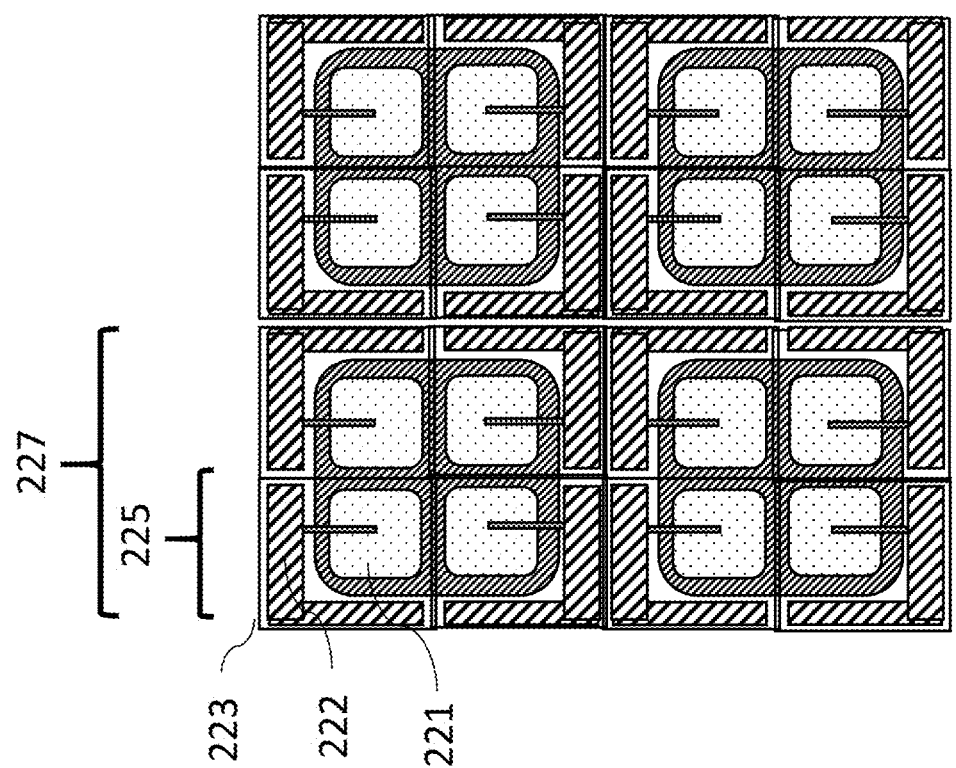

With respect to FIG. 2C a third example detector arrangement is shown which shows improved efficiencies on a pixel level when compared to the examples shown in FIGS. 2A and 2B. The third example detector arrangement is one wherein diodes 221 or photosensitive pixels are grouped or clustered in arrays of pixels (for example a 2 by 2 array of pixels) which may be defined as a macro-pixel. Each diode in an array is coupled, via coupling 222, to non-photosensitive regions 223.

In this example, the arrangement may be considered to be an array of macro-pixel cells 227 which comprise four cells 225. Each cell 225 comprising an individual diode 221 and associated non-photosensitive circuitry 223 arranged on two sides of the cell such that when the four cells arranged together the macro-pixel cell 227 has a central photosensitive region and a peripheral non-photosensitive region. Although the cell is shown in a square or rectangular form the cell may be any suitable shape and the clustering may be any suitable clustering. In this example each macro-pixel is 'separated' from other macro-pixels by the non-photosensitive regions on the periphery of each macro-pixel. These examples further may produce a similar advantage to the examples shown earlier in that the coupling between the photosensitive areas and the non-photosensitive regions is kept relatively constant from diode to diode and as such any time sensitive signals from the diode to the circuitry are consistently handled.

Figure 2D:
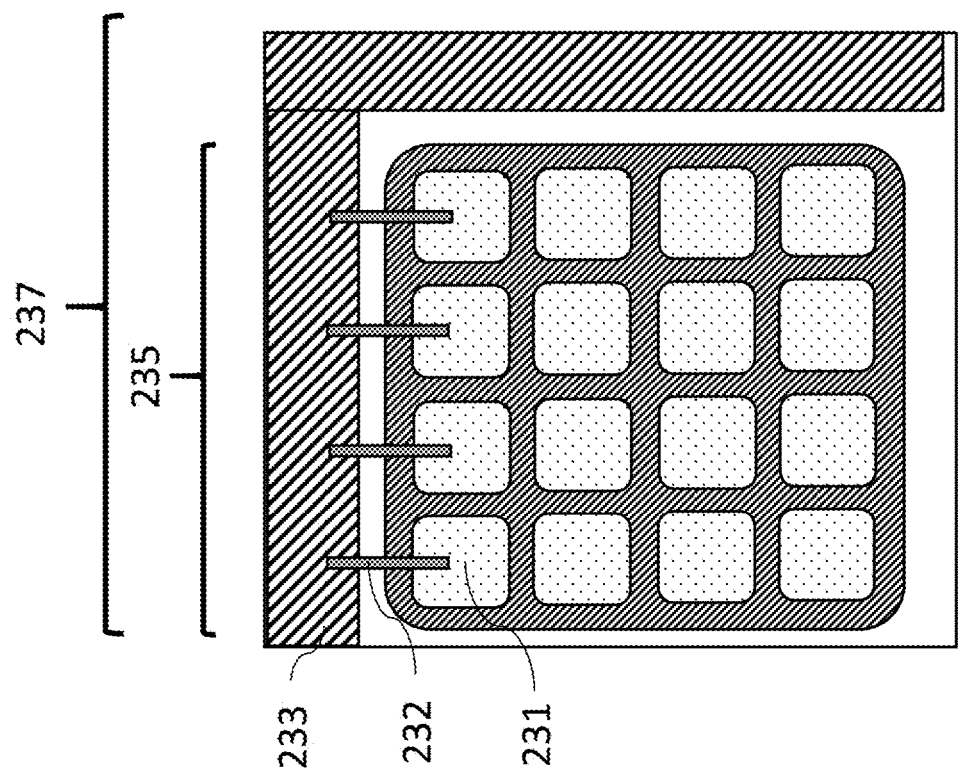

With respect to FIG. 2D, a fourth example detector arrangement is shown. This example attempts to improve on the efficiencies shown on a pixel level in the third example shown in FIG. 2C by grouping or clustering pixels. Thus the fourth example detector arrangement is one wherein diodes 231 or photosensitive pixels are grouped or clustered in arrays of pixels (for example a 4 by 4 array of pixels) which may be defined as a macro-pixel 235. The diodes in an array are then coupled, via coupling 232, to non-photosensitive regions 233.

In this example the arrangement may be a macro-pixel cell 237 which comprises the photosensitive region 235 and non-photosensitive region 233. The photosensitive region 235 comprises the array of individual diodes 231 (in this example shown as a 4 row by 4 column array of photodiodes) and associated non-photosensitive circuitry 233 arranged on two sides of the cell such that when the macro-pixel cells is adjacent other macro-pixel cells 237 the photosensitive region is surrounded by non-photosensitive regions. Although the macro-pixel cell is shown in a square or rectangular form the macro-pixel cell may be any suitable shape. These examples further may produce a similar advantage to the examples shown earlier in that the coupling between the photosensitive areas and the non-photosensitive regions is kept relatively constant from diode to diode and as such any time sensitive signals from the diode to the circuitry are consistently handled.

In the second, third and fourth examples the grouping of the photosensitive region, for example on a row/column or in a macro-pixel arrangement enables the ability to furthermore disable individual diodes. Thus for example the macro-pixel cell may be configured with circuitry such that each individual pixel may be enabled or disabled based on a determination of light levels. Furthermore the examples as shown in FIGS. 2A to 2D furthermore improves the fill factor through well sharing. This improvement applies equally to situations where there are implemented light sources with structured and non-structured light patterns.

Figure 2E:
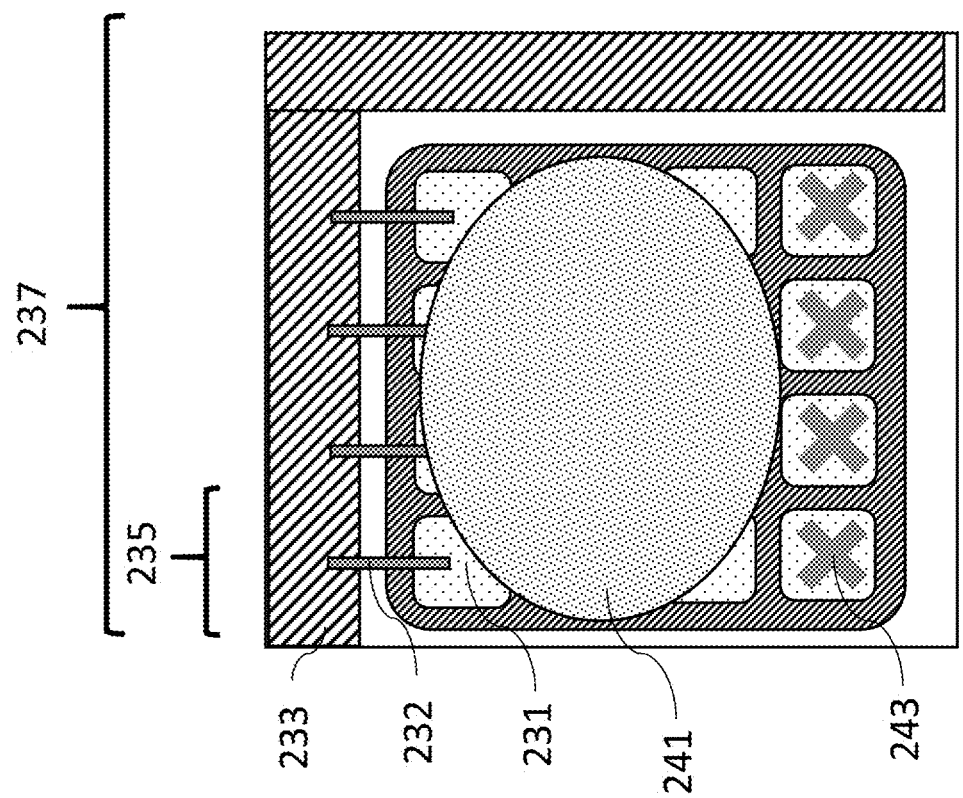
FIG. 2E shows a schematic view of the example photosensitive detector arrangement shown in FIG. 2D with switchable photodiodes according to some embodiments.

Additionally higher fill factors may be achieved where a structured light pattern is present as light may be focused on the light sensitive diode areas only. For example FIG. 2E shows an example of the fourth example detector arrangement wherein a light spot 241 is located over the first to third rows of individual photodiodes in the macro-pixel and not over the fourth row of individual photodiodes. In some embodiments the difference between the light levels detected by the individual photodiodes in the first to third rows compared to the fourth row may enable the circuitry to disable the individual photodiodes on the fourth row (shown by the cross 243).

Figure 3:
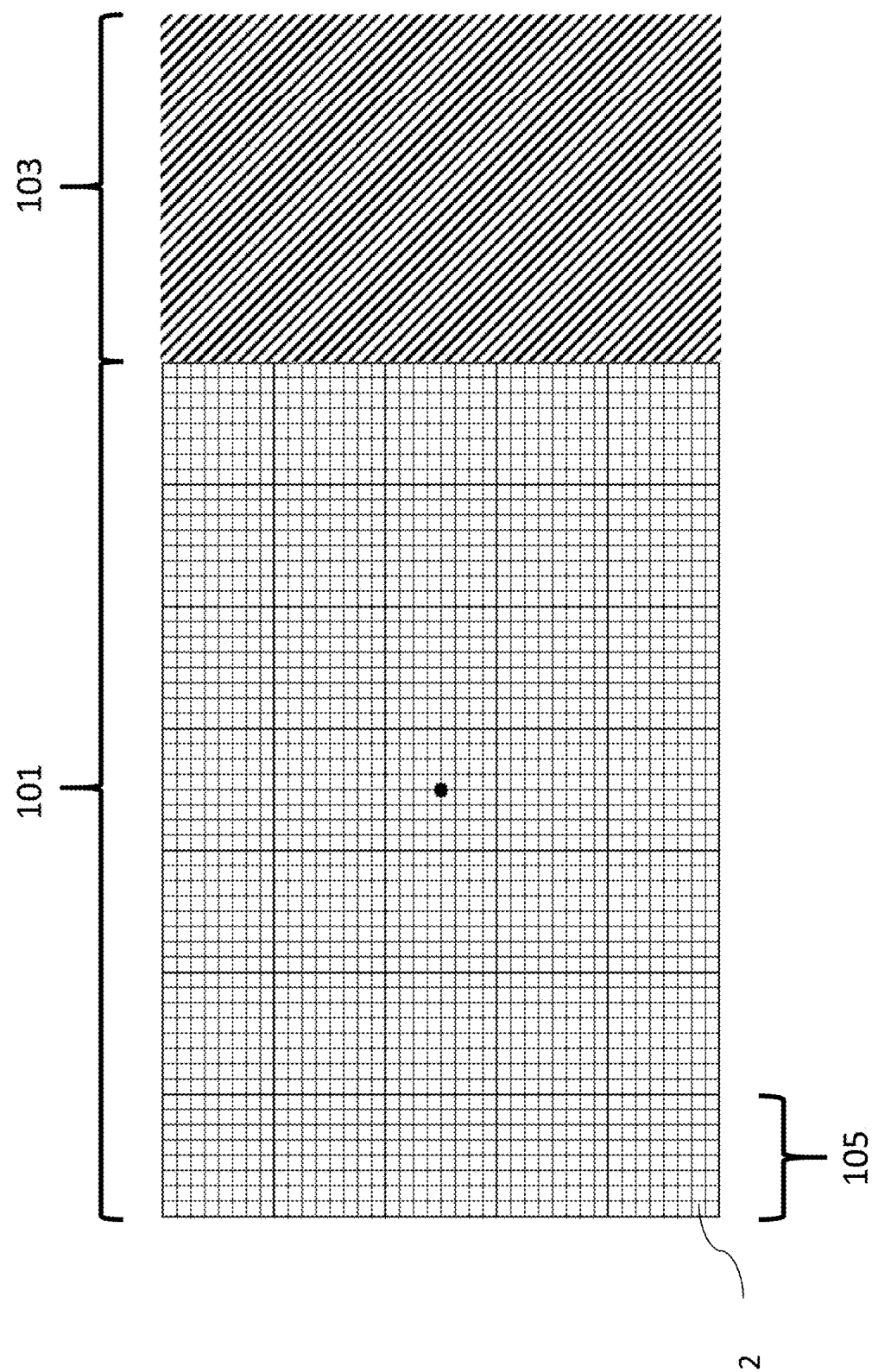
FIG. 3 shows a schematic view of a conventional photosensitive detector arrangement of photosensitive and non-photosensitive areas.

With respect to FIG. 3, an example detector arrangement at macropixel level is shown. In this arrangement the pixels (or photodiodes) 2 (each shown by a small box) are arranged in an array configuration of 8 by 8 pixels (photodiodes) forming a macro-pixel (for example shown as box 105) and an arrangement of 5 rows by 7 columns of macro-pixels which define the photosensitive region or area 101. The photosensitive region 101 is adjacent to a non-photosensitive region or area 103. The non-photosensitive region 103 may be used for quench circuitry, pulse conditioning logic, aggregation logic, digital counters and other logic associated with the pixels (photodiodes) 2. This arrangement is known a contiguous arrangement wherein all of the photosensitive area is located together.

In some embodiments non-contiguous detector arrangements may also be advantageous in environments which employ structured light. As described earlier, structured light is generated by structured light sources which generate a determined light pattern. An example structured light pattern on the detector arrangement shown in FIG. 3 is shown in FIG. 4A.

Figure 4A:
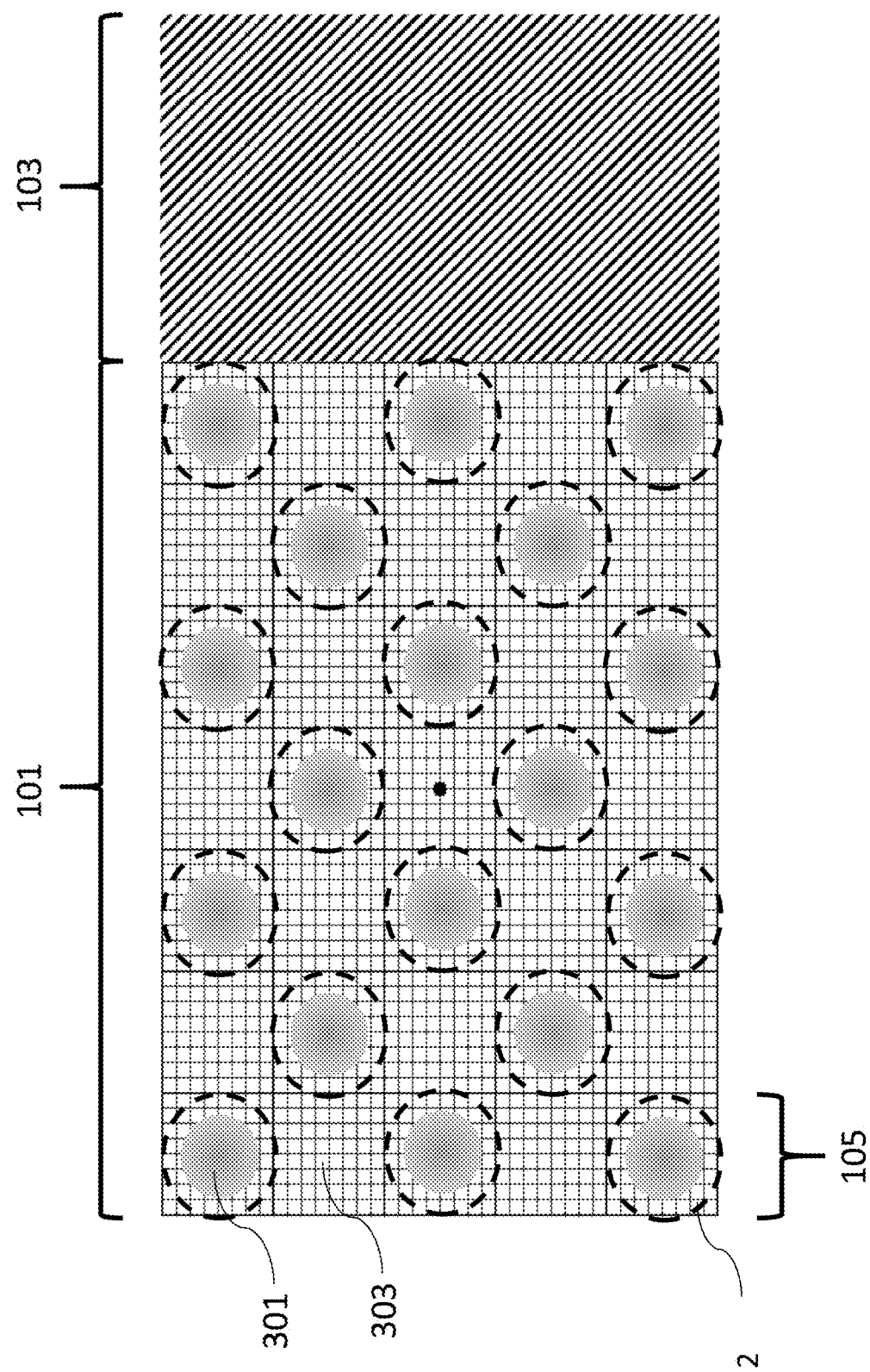
FIG. 4A shows a schematic view of a conventional photosensitive detector arrangement of photosensitive and non-photosensitive areas exposed to a structured light pattern.

In FIG. 4A, the detector arrangement shown in FIG. 3 is augmented by an example structured light pattern. The structured light pattern shown in FIG. 4A is such that the detector arrangement comprises macro-pixels 301 which detect the structured light and macro-pixels 303 where no light from the structured light pattern is incident.

As can be seen from FIG. 4A, in such an example typically approximately 50% of the macro-pixels are not detecting light.

Figure 4B:
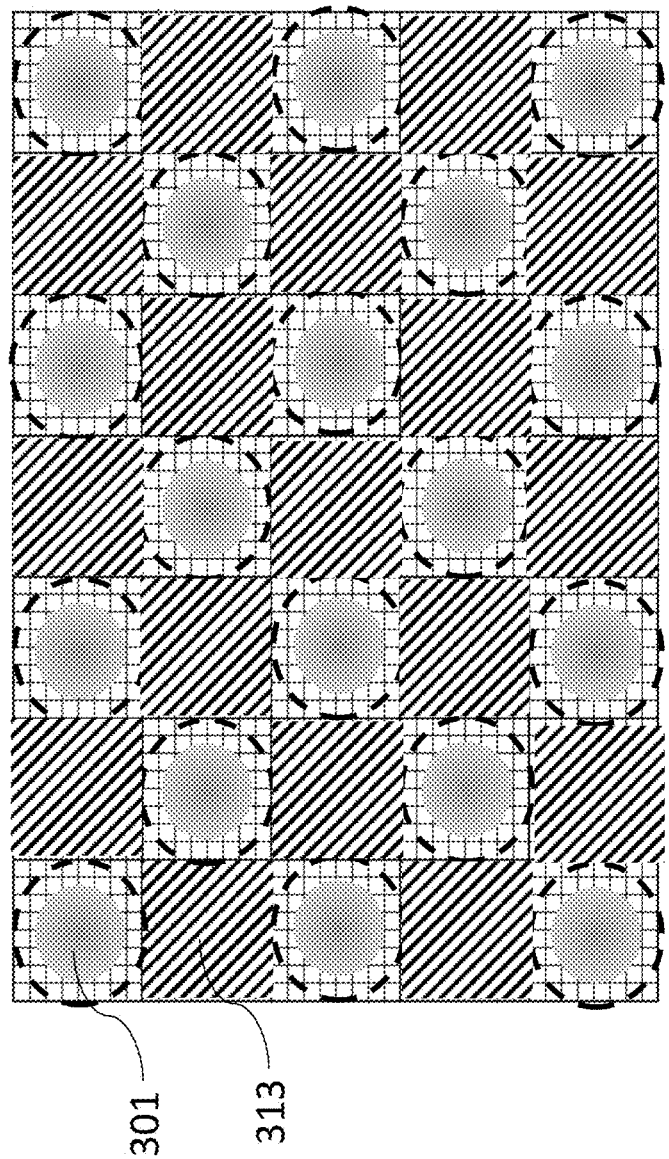
FIG. 4B shows a schematic view of an example photosensitive detector arrangement according to some embodiments exposed to a structured light pattern.

FIG. 4B shows an example macro-pixel arrangement which has an improved efficiency when the structured light pattern shown in FIG. 4A is applied. In this example, detector arrangement macro-pixels are located only where there is an expected structured light pattern element. In other words each macro-pixel which is not expected to detect a structured light pattern element is replaced by a non-photosensitive region 313. This may have advantages over the example detector shown in FIG. 4A in that the efficiency of the detector is improved (there are no zero spots) and furthermore as the non-photosensitive regions are on average closer to the photosensitive regions the speed of the detector is improved and is more consistent from diode to diode.

Figure 4C:
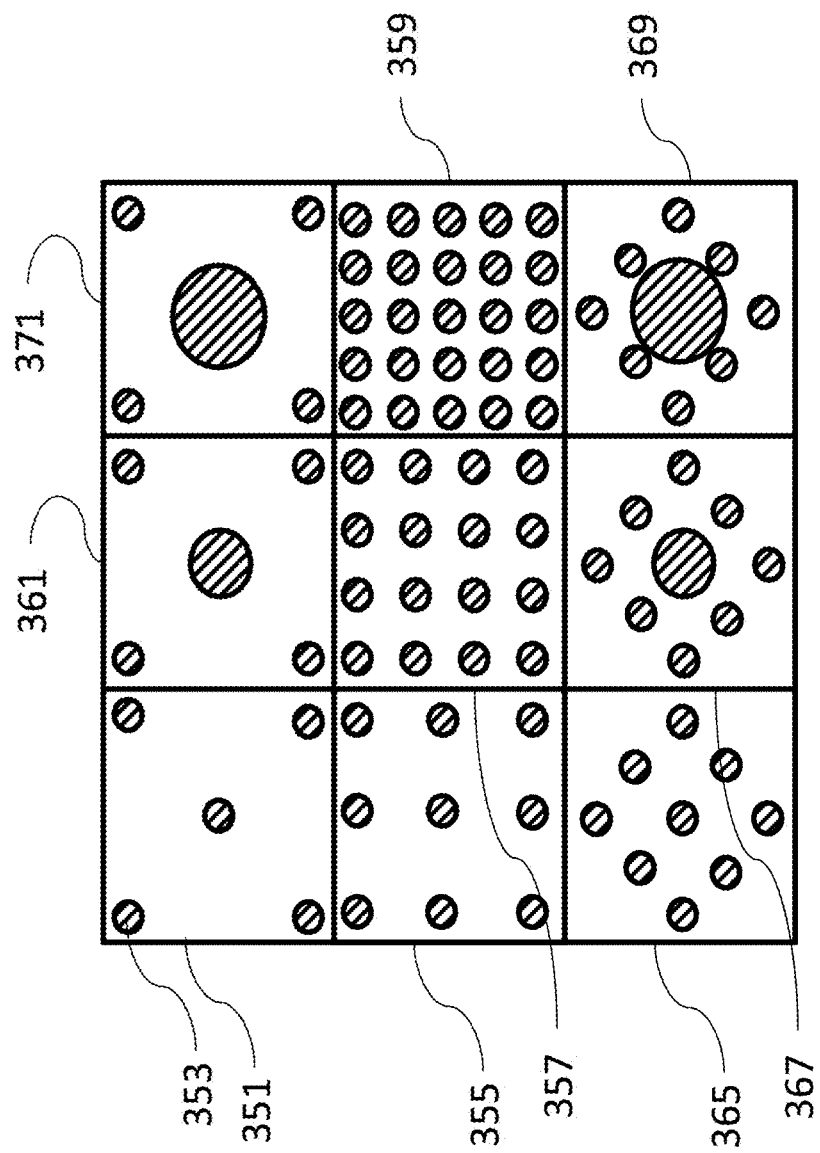
FIG. 4C shows example structured light patterns.

FIG. 4C furthermore shows a series of structured light patterns. The example structured light pattern shown in FIGS. 4A and 4B is shown as the top left 351 pattern of light patterns which may be known as a quincunx arrangement of equal sized light beams 353. The other top row patterns 361, 371 show a modified structured light pattern wherein the central light beam width is increased relative to the outer light beam widths.

The second row of patterns 355, 357, 359 show a square pattern of light beams, with a 3 by 3 pattern 355, a 4 by 4 pattern 357 and a 5 by 5 pattern 359.

The third row of patterns 365, 367, 369, show a 3 by 3 diamond pattern wherein pattern 365 shows equal sized light beams and the other row patterns 367, 369 show a modified structured light pattern wherein the central light beam width is increased relative to the outer light beam widths.

Figure 5:
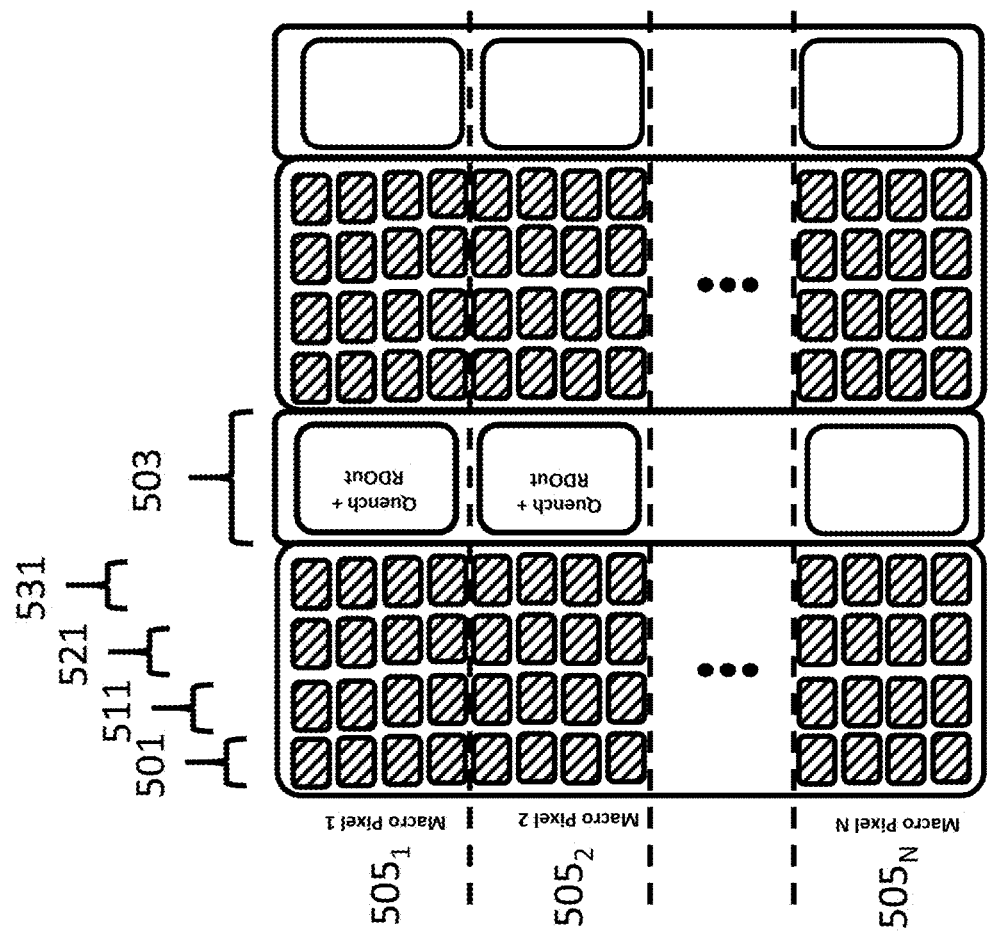
FIG. 5 shows a schematic view of a further photosensitive detector arrangement suitable for 'linear' configuration structured light patterns according to some embodiments.

With respect to FIG. 5, a further example of a detector (SPAD array) module is shown. The example shown in FIG. 5 is one adapted or designed for a linear structured light pattern such as may be generated for a lidar (light detection and ranging) system. The detector module (which in some embodiments comprises a SPAD array) is shown in FIG. 5 as columns of macro-pixels similar to the detector shown in FIG. 2D but where the macro-pixels are arranged with non-photosensitive regions on one side. The detector shown in FIG. 5 therefore comprises a line or linear array of photosensitive regions, shown by macro pixel 1 $505_1$, macro pixel 2 $505_2$, to macro pixel N $505_N$, arranged as a column and which are associated with an adjacent column 503 of non-photosensitive regions (and as shown in FIG. 5 may be used for quench and readout circuitry). This pattern of a column of macro-pixels and a column of non-photosensitive circuitry may then be repeated for further columns of photosensitive regions and non-photosensitive regions. In the example shown in FIG. 5, each photosensitive macro-pixel comprises SPAD pixels of which the columns 501, 511, 521, 531 of SPAD pixels are shown.

In such a manner the detector may be designed to take advantage of well sharing for pixels in order to maximize fill factor (FF). Furthermore in some embodiments the column width can be varied. For example the width of the non-photosensitive (or generally the logic column) may be aligned to a transmission blade step size for the application.

In such embodiments the effective FF would be that of the photosensitive (SPAD) cluster only. This may for example be in the region of 90%.

In summary, this application shows a series of detector which have been designed to move from design of contiguous photodiode (for example SPAD) arrays or more generally photosensitive regions to 'islands' of photodiodes. This may the advantage in that the photosensitive regions are equally distanced from the non-photosensitive regions.

Furthermore where a detector is configured to receive a structured light pattern the examples shown herein may have a further advantage where the detector is designed based on the pattern in that the design may be such that as many as possible photosensitive detectors are configured to see a return signal and there are as few as possible detectors which are in the 'dark' spots. The photosensitive detectors could be replaced with digital logic and by moving digital out of each individual photosensitive detector, the individual photosensitive detector fill factor can be increased.

Furthermore the overall size of the die in employing these embodiments can be optimized.

The optimization may be seen as being able to be employed on a diode level, a macro-pixel level and furthermore on an array level.

It should be appreciated that the detector module may be implemented within any suitable device. By way of example only and without limitation, that device may be a mobile telephone, smart phone, tablet, computer, measuring device, switch controller such as for a light, controlling a water supply such as in a tap or toilet, door controller, distance sensor, impact controller, or any other suitable device.

Some embodiments may use other sensors. These sensors may be integrating photo-sensitive elements capable of receiving light intensity, time of arrival, frequency or phase or amplitude/intensity modulation, wavelength (color) or other information.

It should be appreciated that the above described arrangements may be implemented at least partially by an integrated circuit, a chip set, one or more dies packaged together or in different packages, discrete circuitry or any combination of these options.

Various embodiments with different variations have been described here above. It should be noted that those skilled in the art may combine various elements of these various embodiments and variations.

Such alterations, modifications, and improvements are intended to be part of this disclosure, and are intended to be within the scope of the present disclosure. Accordingly, the foregoing description is by way of example only and is not intended to be limiting. The present disclosure is limited only as defined in the following claims and the equivalents thereto.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An apparatus, comprising:
    at least one detector configured to receive a return light from an object within a detector field of view, the light generated by a structured light source configured to generate a structured light pattern, the detector including:
        first and second photosensitive regions configured to receive the return light generated by the structured light source, the first photosensitive region comprising a first macro-pixel and the second photosensitive region including a second macro-pixel, each of the first and second macro-pixels having a respective plurality of photodiodes arranged in a defined configuration; and
        at least one non-photosensitive region, wherein the first and second photosensitive regions are separated by the at least one non-photosensitive region and the at least one non-photosensitive region is associated with one of the first and second photosensitive regions,
        wherein the apparatus is configured to enable or disable the plurality of photodiodes of each of the first and second macro-pixels based on a light level of the structured light pattern detected by the first and second macro-pixels.

2. The apparatus of claim 1 wherein the first and second photosensitive regions comprise first and second photodiodes, and the at least one non-photosensitive region comprises circuitry associated with one of the first and second photodiodes.

3. The apparatus of claim 1 wherein the at least one non-photosensitive region comprises circuitry associated with one of the first and second macro-pixels.

4. The apparatus of claim 1 wherein the first and second photosensitive regions comprise first and second arrays of macro-pixels, the macro-pixels of the first and second arrays of macro-pixels each including two or more photodiodes arranged in a defined configuration, and the at least one non-photosensitive region comprises circuitry associated with one of the first and second arrays macro-pixels.

5. The apparatus of claim 1, further comprising the structured light source, wherein the structured light source is configured to generate the structured light pattern having at least two separate light pattern elements.

6. The apparatus of claim 5 wherein the first and second photosensitive regions are arranged on the detector to match an expected return light pattern based on the structured light pattern.

7. The apparatus of claim 1 wherein each of the first and second photosensitive regions includes at least one single photon avalanche diode.

8. The apparatus of claim 1 wherein the at least one non-photosensitive region includes at least one of:
    quench logic;
    signal conditioning logic for processing outputs of the associated one of the first and second photosensitive regions;
    digital counter logic;
    aggregation logic; or
    timing logic.

9. The apparatus of claim 1 wherein the structured light source is configured to generate the structured light pattern having an array of light beams.

10. The apparatus of claim 1 wherein the apparatus is configured to enable the plurality of photodiodes of each of the first and second macro-pixels in response to the first and second macro-pixels detecting the structured light pattern.

11. The apparatus of claim 1 wherein the apparatus is configured to disable the plurality of photodiodes of each of the first and second macro-pixels in response to the first and second macro-pixels detecting a low light level of the structured light pattern.

12. A method, comprising:
    forming a photosensitive detector by:
        forming first and second photosensitive regions configured to receive a return light from a structured light source configured to generate a structured light pattern, the first photosensitive region comprising a first macro-pixel and the second photosensitive region including a second macro-pixel, each of the first and second macro-pixels having a respective plurality of photodiodes arranged in a defined configuration;
        forming at least one non-photosensitive region, wherein the first and second photosensitive regions are separated by the at least one non-photosensitive region and the at least one non-photosensitive region is associated with one of the first and second photosensitive regions; and
        enabling or disabling the plurality of photodiodes of each of the first and second macro-pixels based on a light level of the structured light pattern detected by the first and second macro-pixels.

13. The method of claim 12 wherein forming the first and second photosensitive regions comprises:
    forming two photodiodes, and the at least one non-photosensitive region comprises circuitry associated with one of the two photodiodes.

14. The method of claim 12 wherein the at least one non-photosensitive region comprises circuitry associated with one of the first and second macro-pixels.

15. The method of claim 12 wherein forming the first and second photosensitive regions comprises:
    forming two arrays of macro-pixels, the macro-pixels of the two arrays of macro-pixels each including two or more photodiodes arranged in a defined configuration, and the at least one non-photosensitive region comprises circuitry associated with one of the two arrays macro-pixels.

16. An apparatus, comprising:
at least two photosensitive means for receiving a return light generated by a structured light source configured to generate a structured light pattern, the at least two photosensitive means including first and second photosensitive regions configured to receive the return light generated by the structured light source, the first photosensitive region comprising a first macro-pixel and the second photosensitive region including a second macro-pixel, each of the first and second macro-pixels having a respective plurality of photodiodes arranged in a defined configuration; and
at least one non-photosensitive means, wherein the at least two photosensitive means are separated by the at least one non-photosensitive means and the at least one non-photosensitive means is associated with one of the at least two photosensitive means,
wherein the apparatus is configured to enable or disable the plurality of photodiodes of each of the first and second macro-pixels based on a light level of the structured light pattern detected by the first and second macro-pixels.

17. The apparatus of claim 16 wherein:
the first and second photosensitive regions comprise two photodiodes, and the at least one non-photosensitive means comprises circuitry associated with one of the two photodiodes.

18. The apparatus of claim 16, further comprising the structured light source, wherein the structured light source is configured to generate the structured light pattern having at least two separate light pattern elements.

19. The apparatus of claim 16 wherein the first and second photosensitive regions comprise two arrays of macro-pixels, the macro-pixels each including two or more photodiodes arranged in a defined configuration, and the at least one non-photosensitive means comprises circuitry associated with one of the two arrays macro-pixels.

20. The apparatus of claim 16 wherein the apparatus is configured to enable the plurality of photodiodes of each of the first and second macro-pixels in response to the first and second macro-pixels detecting the structured light pattern.

* * * * *